United States Patent
Yoshihara

(10) Patent No.: US 7,791,969 B2
(45) Date of Patent: Sep. 7, 2010

(54) METHOD AND APPARATUS FOR SCREENING BIT LINE OF A STATIC RANDOM ACCESS MEMORY (SRAM) FOR EXCESSIVE LEAKAGE CURRENT

(75) Inventor: Hiroshi Yoshihara, Round Rock, TX (US)

(73) Assignee: Sony Computer Entertainment Inc., Tokyo (JP)

( * ) Notice: Subject to any disclaimer, the term of this patent is extended or adjusted under 35 U.S.C. 154(b) by 121 days.

(21) Appl. No.: 11/934,919

(22) Filed: Nov. 5, 2007

(65) Prior Publication Data

US 2009/0116320 A1    May 7, 2009

(51) Int. Cl.
*G11C 29/48* (2006.01)

(52) U.S. Cl. .................. 365/201; 365/156; 365/154; 365/190; 365/203; 365/189.07

(58) Field of Classification Search ................. 365/201, 365/156, 154, 190, 203, 230.06, 189.07
See application file for complete search history.

(56) References Cited

U.S. PATENT DOCUMENTS

| | | | |
|---|---|---|---|
| 5,596,538 A * | 1/1997 | Joo | 365/201 |
| 5,757,696 A * | 5/1998 | Matsuo et al. | 365/185.07 |
| 5,991,219 A | 11/1999 | Nakashima | |
| 6,195,278 B1 * | 2/2001 | Calin et al. | 365/49.17 |
| 6,584,026 B2 * | 6/2003 | Kawasumi | 365/205 |
| 2008/0103708 A1 * | 5/2008 | Inoue et al. | 702/60 |
| 2009/0116320 A1 * | 5/2009 | Yoshihara | 365/201 |

* cited by examiner

*Primary Examiner*—Andrew Q Tran
(74) *Attorney, Agent, or Firm*—Matthew B. Dernier; Gibson & Dernier LLP

(57) ABSTRACT

Methods and apparatus provide for testing an SRAM cell, the SRAM cell including an anti-parallel storage circuit operable to store a logic high or low value across a true node and a complementary node, where the true node and complementary node are coupled to a true bit line (BLT) and a complementary bit line (BLC), by first and second transistors, respectively, the method including: preventing a write driver circuit from significantly pulling the BLT towards a supply voltage; preventing a pre-charge circuit from significantly pulling the BLT towards the supply voltage; preventing the first transistor from significantly pulling the BLT towards the voltage stored in the SRAM cell; and comparing the voltage of the BLT under the foregoing conditions to a threshold voltage.

8 Claims, 6 Drawing Sheets

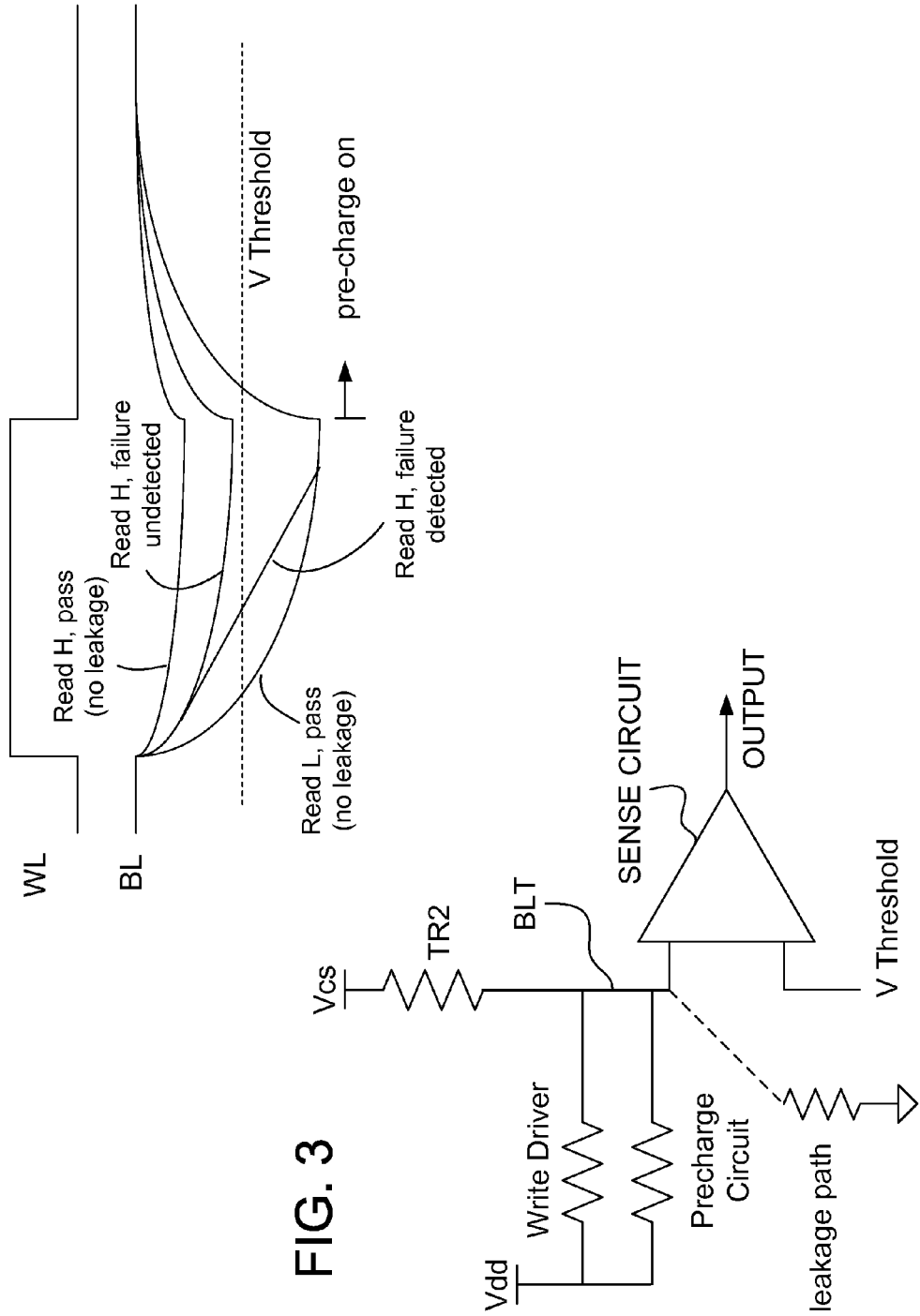

METHOD AND APPARATUS FOR SCREENING BIT LINE OF A STATIC RANDOM ACCESS MEMORY (SRAM) FOR EXCESSIVE LEAKAGE CURRENT

BACKGROUND

The present invention relates to methods and apparatus for screening a static random access memory (SPAM) and, in particular, for improving the quality of the screening process so as to better detect leakage paths from the bit line of the SRAM to ground.

With reference to FIGS. 1A-1B, SRAM memory cells store data in the form of complementary low voltage and high voltage at opposite sides of the cell. An SRAM, unlike dynamic random access memory (DRAM), maintains the data content of the memory calls as long as power is applied to the cell. DRAM memory cells, on the other hand, are periodically refreshed with the stored data content.

An SRAM cell includes a "true" node associated with a bit line (BLT) of the SRAM memory and a complementary node associated with a complementary bit line (BLC) of the SRAM memory. When the true node is read as a high voltage, the value of the SRAM memory cell is digital one. If the true node is read as a low voltage, the value of the SRAM memory cell is a digital zero. Each memory cell of a conventional SRAM memory employs an anti-parallel inverter transistor latch circuit coupled across the BLT bus and the BLC bus. A pair of series-coupled transistors connect/disconnect the cell to the BLT and BLC bus. The series transistors are gated via the word line (WL). During write and read cycles, a conventional SRAM memory system will employ a pre-charge circuit to drive the bit line BLT and the complementary bit line BLC to a power supply voltage of the SRAM memory, Vdd, before data is written to the memory cell. During the time that the data is actually written to the SRAM memory cell, the word line WL is true and a write buffer drives the bit line BLT and the complementary bit line BLC. During the read operation, the word line WL is again true and the active components of the SRAM memory cell itself will drive the bit line BLT, which is sensed to determine the value of the stored data bit in the cell.

A sense amplifier detects the level of the local BLT to determine the stored data in a given cell. The conventional circuitry for sensing the contents of each memory cell via the bit line BLT includes a basic sensing circuit, which compares a predetermined voltage (V threshold) to the voltage on BLT.

As illustrated in FIG. 1B, without leakage, a stored logic level H is sensed above the threshold and is correctly detected as passing the test. With leakage, however, the pull-up circuitry (e.g., the word line WL, write driver, etc.) tends to counteract the leakage draw and the stored logic level H may still be sensed above the threshold—which is not a desirable condition because it would be better to sense this situation as a failure. Unfortunately, conventional sensing circuitry and protocols do not take into consideration whether there is excessive leakage from the BLT to ground during testing of the SRAM.

The problem of incorrectly determining that a cell is operating properly (i.e., a false positive or pass) becomes significantly worse as the frequency of the clock increases and the size of the SRAM increases, which is an ongoing circumstance as higher and higher memory performance remains a design goal. Accordingly, there is a need in the art for a new approach to screening SRAM memory cells in order to detect memory cells in which the leakage characteristics of the cell are unacceptably high.

SUMMARY OF THE INVENTION

In accordance with the invention, the pull-up circuitry of the SRAM is disabled during the reading test in order to detect the existence of a leakage condition. In particular, the word line WL is turned off, the pre-charge circuitry is turned off, and the write driver circuitry is turned off. In such a situation, the stored level of H is quickly pulled down below the threshold if excessive the leakage current exists. The situation is thus correctly detected as a failure.

In accordance with one or more embodiments of the invention, methods and apparatus provide for: testing an SRAM cell, the SRAM cell including an anti-parallel storage circuit operable to store a logic high or low value across a true node and a complementary node, where the true node and complementary node are coupled to a true bit line (BLT) and a complementary bit line (BLC), by first and second transistors, respectively. The method includes: preventing a write driver circuit from significantly pulling the BLT towards a supply voltage; preventing a pre-charge circuit from significantly pulling the BLT towards the supply voltage; preventing the first transistor from significantly pulling the BLT towards the voltage stored in the SRAM cell; and comparing the voltage of the BLT under the foregoing conditions to a threshold voltage.

The method may further include determining that the SRAM cell includes significant leakage current when the voltage of the BLT is below the threshold voltage. Alternatively or in addition, the method may include determining that the SRAM cell includes significant leakage current when the voltage of the BLT drops linearly below the threshold voltage.

Other aspects, features, advantages, etc. will become apparent to one skilled in the art when the description of the invention herein is taken in conjunction with the accompanying drawings.

BRIEF DESCRIPTION OF THE DRAWINGS

For the purposes of illustrating the various aspects of the invention, there are shown in the drawings forms that are presently preferred, it being understood, however, that the invention is not limited to the precise arrangements and instrumentalities shown.

FIG. 3 is an equivalent circuit schematic of an embodiment of an SRAM memory cell suitable for use with the system of FIG. 2 and other embodiments herein;

FIG. 4 is a graph illustrating timing relationships among numerous signals in the SRAM memory cell of FIG. 3;

DETAILED DESCRIPTION OF THE PRESENT INVENTION

Figure 2:
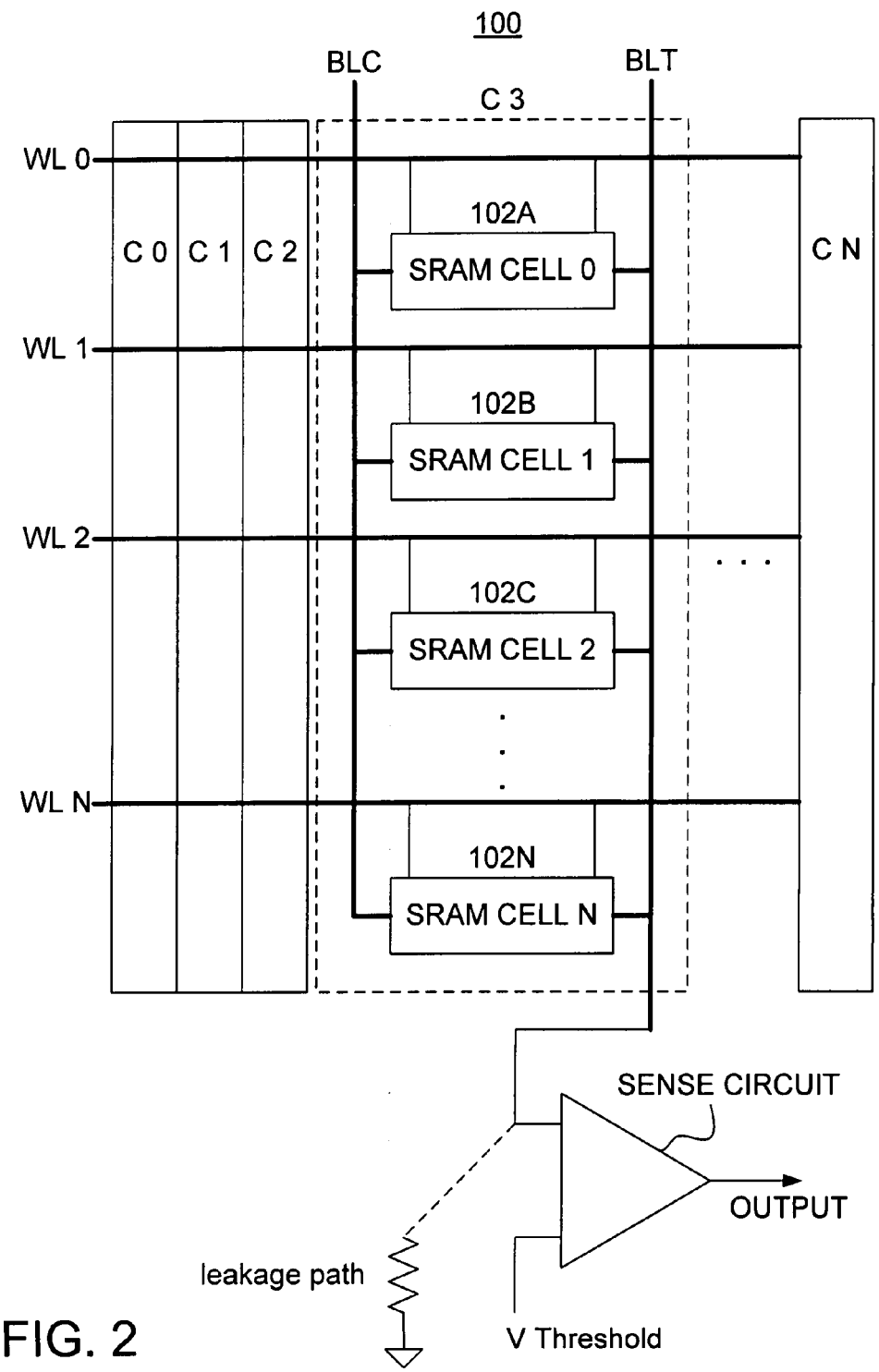
FIG. 2 is a block diagram illustrating an SPAM memory system in accordance with one or more embodiments of the present invention.

With reference to the drawings, wherein like numerals indicate like elements, there is shown in FIG. 2 an SRAM memory system 100 that may be adapted for carrying out one or more features of the present invention. For the purposes of brevity and clarity, the block diagram of FIG. 2 will be referred to and described herein as illustrating an apparatus 100, it being understood, however, that the description may readily be applied to various aspects of a method with equal force.

The SRAM memory system 100 includes a plurality of SRAM memory cells 102 arranged in an array of rows and columns. In general, each row in the array represents a word of data (such as 128 bits in width), and each column in the array represents a given bit position within each word of data. Each word on the SRAM memory system 100 is accessed by activating an associated word line (WL) and bit lines (BLC and BLT). The BLT is the "true" bit line and the BLC is the complementary bit line of the given column, e.g., C3, of the SRAM memory 100. When the true node (or true bit line) is read as a high voltage, the value of the accessed SRAM memory cell 102 is digital one. If the true node is read as a low voltage, the value of the SRAM memory cell 102 is a digital zero.

Although not shown in FIG. 2, one skilled in the art will appreciate that a number of further components of the SRAM memory system 100 may be employed, such as read and write pre-charge circuits, a write buffer (driver), feedback circuitry, and further components of a sense amplifier, etc. (Embodiments of one or more of these circuits, however, are shown and described later herein.)

Figures 1A, 1B:
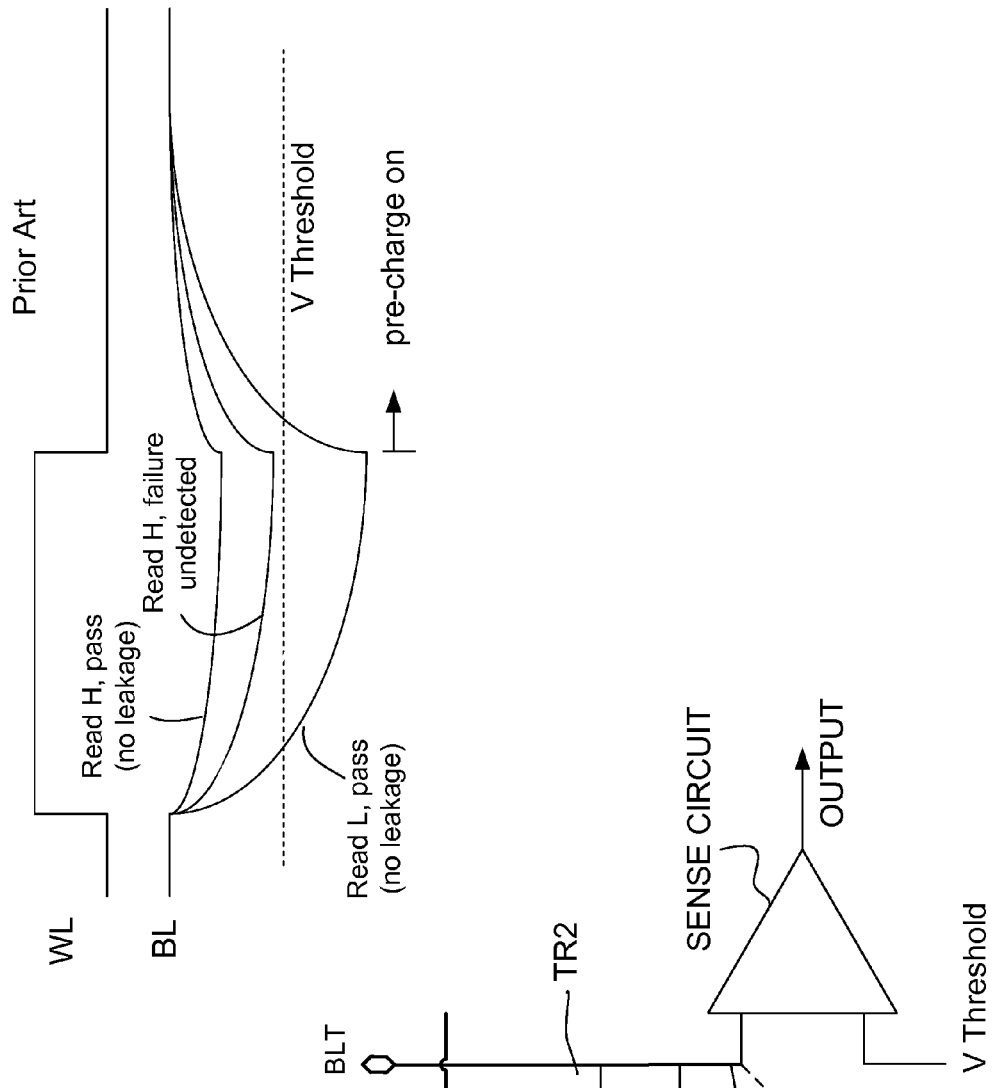
FIG. 1A is a block diagram illustrating an SRAM memory cell and evaluation circuit in accordance with the prior art.
FIG. 1B is a graph illustrating timing relationships among numerous signals in the SRAM memory cell of FIG. 1A.

Each SRAM cell 102 includes a pair of inverters arranged in an anti-parallel configuration, as was illustrated in FIG. 1A. The anti-parallel inverters are implemented using a plurality of (field effect transistors) FETs interconnected such that respective storage nodes are associated with true bit line BLT and complementary bit line BLC. The "true" storage node and the "complementary" storage node are coupled to the true bit line BLT and the complementary bit line BLC by way of respective NMOS transistors TR2 and TR3. It is noted that while NMOS technology is a preferred implementation for transistors TR2 and TR3, other technologies may be employed without departing from the embodiments of the invention.

The NMOS transistors TR2 and TR3 are controlled by a word line signal WL, which also activates a plurality of SRAM memory cells used to store a single word of data. As is known to those skilled in the art, and therefore not illustrated, the SRAM memory cell 102 may include, for example, a PMOS transistor and an NMOS transistor connected in series across the power supply potential, Vdd to Vss (or ground). The voltage potential Vdd for the anti-parallel inverter circuitry may be separated from the peripheral circuits (such as the write driver, pre-charge circuit, etc.) to avoid noise issues and/or to achieve better stability. The true node is located at the common connection between the PMOS and NMOS transistors. A second set of PMOS and NMOS transistors are interconnected to produce the complementary node. Again, although this specific circuit topology and implementation is suitable for carrying out one or more embodiments of the invention, those skilled in the art will recognize from the description herein that other implementations are within the scope of the invention.

A bit of data is written to the SRAM memory cell 102 (Write 0 or Write 1) by turning on the respective NMOS transistors via the word line WL and presenting a voltage potential across the bit line BLT and the complementary bit line BLC. The voltage potential across the bit line BLT and the complementary bit line BLC is produced via a write driver circuit that will be discussed in later embodiments herein. A high voltage potential (e.g., Vdd) on the true node and a relatively low voltage potential (e.g., ground) on the complementary node is interpreted as a logic high or digital one (Write 1). Conversely, a relatively low voltage potential on the true node and a relatively high voltage potential on the complementary node is interpreted as a logic low or digital zero (Write 0) It is noted that the read and write pre-charge circuits (not shown) operate to drive the voltage on the bit line BLT and the complementary bit line BLC to certain voltage potentials prior to a read operation or a write operation to the SRAM memory cell 102.

During a write operation in which a logic high is written to the memory cell 102 (Write 1), the bit line BLT is driven to the Vdd potential and the complementary bit line BLC is driven to Vss (e.g., ground) Under these conditions, the PMOS transistor associated with the true node will turn on, the NMOS transistor associated with the true node will turn off, the PMOS transistor associated with the complementary node will turn off, and the NMOS transistor associated with the complementary node will turn on. Thus, the true node will be substantially at the Vdd voltage potential and the complementary node will be substantially at the Vss (or ground) voltage potential.

Those skilled in the art will appreciate that an opposite condition will be achieved during a write operation in which a logic low is written to the memory cell 102 (Write 0). The voltage potentials driving the bit line BLT and the complementary bit line BLC are reversed during a write 0 operation (as compared with a write 1 operation). The bit line BLT is driven to the Vss potential (e.g., ground) and the complementary bit line BLC is driven to Vdd. Under these conditions, the PMOS transistor associated with the true node will turn off, the NMOS transistor associated with the true node will turn on, the PMOS transistor associated with the complementary node will turn on, and the NMOS transistor associated with the complementary node will turn off. Thus, the true node will be substantially at the Vss voltage potential and the complementary node will be substantially at the Vdd voltage potential.

A sense amplifier (or sense circuit) detects the level of the local BLT to determine the stored data in a given cell. The sense circuit monitors the contents of each memory cell via the bit line BLT which compares a predetermined voltage (V threshold) to the voltage on BLT. In some circumstances, the non-ideal characteristics of the SRAM 100 include significant leakage path(s), which is illustrated as a bulk impedance to ground. As discussed above, the leakage paths may result in incorrectly determining that a cell is operating properly (i.e., a false positive or pass), which problem becomes significantly worse as the frequency of the clock increases and the size of the SRAM increases.

With reference to FIGS. 3 and 4, unlike the prior art techniques for sensing a logic high value within the SRAM cell 102, aspects of the present invention ensure that significant leakage paths do not go unnoticed. The resistors illustrated in FIG. 3 represent the respective impedances from Vdd (or separate voltage source Vcs) to the local BLT line, such as from the write driver circuit, the pre-charge circuit, the coupling transistor TR2, etc. In accordance with one or more embodiments of the present invention, the contents of the SRAM memory cell 102 is sensed in such a way as to prevent at least one source of voltage from significantly pulling the BLT towards such source of voltage when the BLT is sensed. For example, one or more of the following may be accomplished: (1) preventing the write driver circuit from significantly pulling the BLT towards a supply voltage; (2) preventing the pre-charge circuit from significantly pulling the BLT towards the supply voltage; and (3) preventing the TR2 transistor from significantly pulling the BLT towards the voltage stored in the SRAM cell 120.

While under one or more of the above conditions, the voltage of the BLT is compared to the threshold voltage. The SRAM cell 120 is determined to include significant leakage current when the voltage of the BLT is below the threshold voltage. Alternatively, or in addition, the SRAM cell 120 may be determined to include significant leakage current when the voltage of the BLT drops linearly below the threshold voltage as shown in FIG. 4.

The above technique may be employed using a single-ended sensing scheme (as illustrated) or a dual-differential sensing scheme (as would be apparent to a skilled artisan from the disclosure herein. As the sense amplifier circuits used in sensing SRAM memories are required to operate at high speed, the dual-differential sensing approach is often implemented using current mirror type differential amplifier circuits. Irrespective of the specific dual-differential sensing implementation, two main sources of erroneous sensing operation remain: (1) leakage current errors (discussed above), and (2) input current and input threshold imbalance.

Putting aside the leakage current issue for a moment, dual sensing differential amplifier circuits may output an erroneous value because the sense amplifier circuit itself may have an input current/threshold unbalance. Some artisans have proposed trimming the sense amplifier, such as is disclosed in U.S. Pat. No. 5,991,219. This approach may be used in accordance with one or more embodiments of the present invention.

In accordance with one or more further embodiments of the present invention, the sense amplifier unbalance may be accounted for by applying a constant input threshold to the sense amplifier. The input threshold should be less than about Vdd−Vth. (Alternatively, an additional amplifier may be employed that exhibits a constant input threshold voltage.) By way of example, in order to exclude the sense amplifiers unbalance, the leakage of BLT may be tested using a circuit that connects BLC to a voltage potential of Vt_in, where Vt_in is less than about Vdd−Vth (Vth of an N-channel FET). If leakage current is present, the BLT value will be below Vt_in, the sense amp should be flipped. In the alternative, or in addition, the sense amplifier's unbalance may be accounted for by connecting an inverter as a second sensing circuit for each BLT and BLC.

The above technique for sensing the value of the BLT was tested using a Powerspice™ t2h00a model. The model parameters included Tj=85 degrees C., nominal Vdd=Vcs=0.9 V, NRN=0.5, Frequency=333 MHz, a local BLT with sixteen memory cells, local evaluation circuit (used to interface the BLT to a global bit line (GBL), a word line WL driver circuit, and resistance (100 KOhm) between ground potential and the BLT.

Figure 5A:
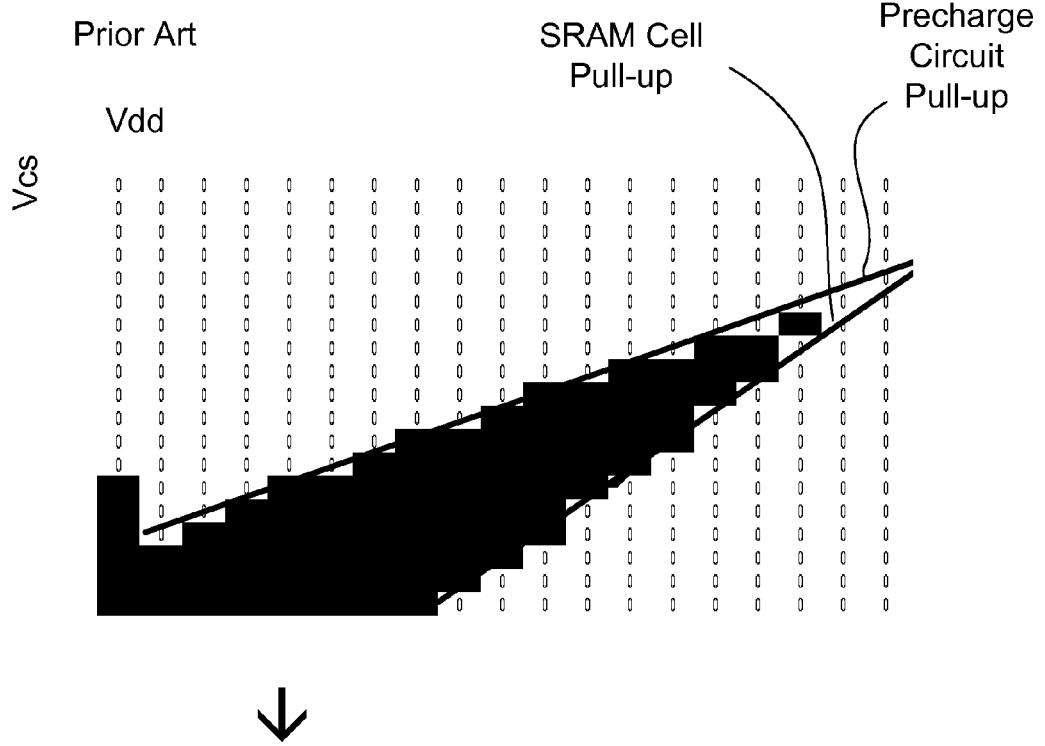
FIG. 5A is a graph illustrating pass/fail test results obtained by simulation using the conventional screening techniques of FIGS. 1A-1B.

With reference to FIG. 5A, pass/fail "shmoo" results are illustrated using the prior art technique of sensing the BLT. The Y-axis represents increasing Vcs, while the X-axis represents increasing Vdd. The white areas are the pass conditions and the black areas are the fail conditions. As shown, the fail conditions of the shmoo form a finger shape. The upper bound on the failure profile of the shmoo of FIG. 5A is due to the pull-up characteristics of the pre-charge circuit, e.g., the tendency of the transistors of the pre-charge circuit to pull the BLT toward a high value during sensing, thereby counteracting the effects of leakage current flow. The lower bound on the failure profile of the shmoo FIG. 5A is due to the pull-up characteristics of the SRAM cell 120 itself, e.g., the tendency of the transistor TR2 to pull the BLT toward a high value during sensing, again counteracting the effects of leakage current flow. These upper and lower bounds represent the potential to incorrectly determine that the SRAM has passed the screening process (as discussed above).

Figure 5B:
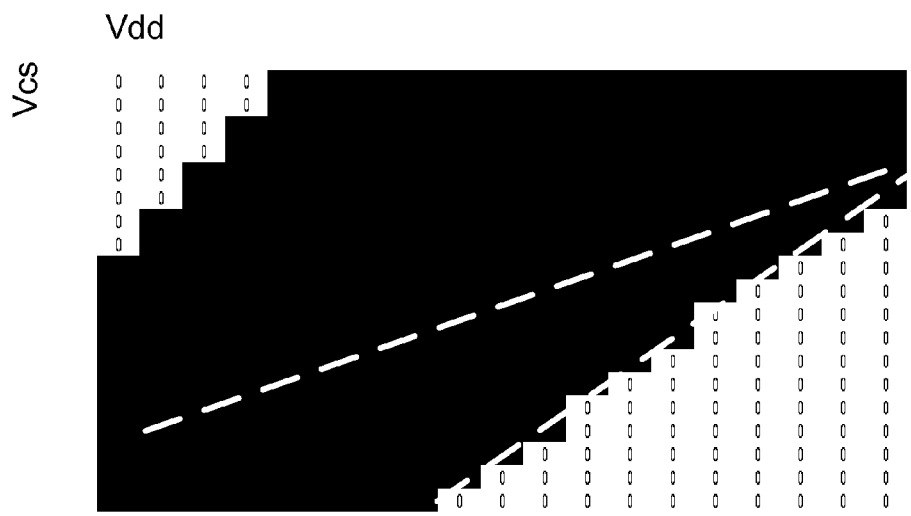
FIG. 5B is a graph illustrating pass/fail test results obtained by simulation using the novel screening techniques of the present invention.

With reference to FIG. 5B, pass/fail "shmoo" results are illustrated using one or more aspects of the present invention for sensing the BLT. In particular, the following conditions are in place: (1) preventing the write driver circuit from significantly pulling the BLT towards a supply voltage; (2) preventing the pre-charge circuit from significantly pulling the BLT towards the supply voltage; and (3) preventing the TR2 transistor from significantly pulling the BLT towards the voltage stored in the SRAM cell 120. As shown, the fail conditions of the shmoo have expanded beyond the finger shape of the prior art (shown in white line).

Figure 6A:
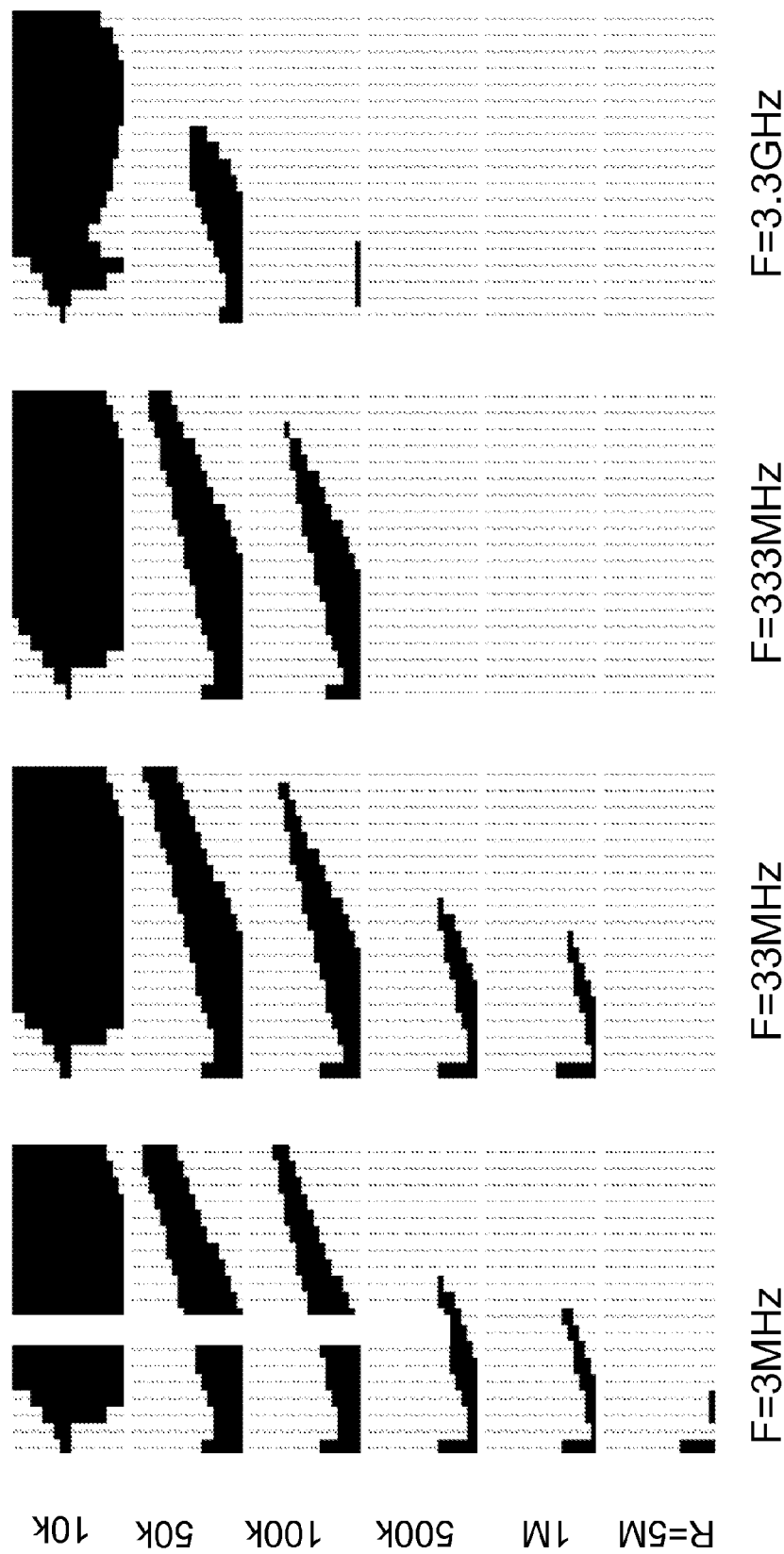
FIG. 6A are graphs illustrating pass/fail test results obtained by simulation using the conventional screening techniques of FIGS. 1A-1B over different supply voltage, leakage, and frequency conditions.

It is noted that frequency of operation of the SRAM 100 and the value of the impedance between ground potential and the BLT can also effect the shape of the shmoo. With reference to FIG. 6A, pass/fail "shmoo" results are illustrated using the prior art technique of sensing the BLT over varying frequency (3 MHz, 33 MHz, 333 MHx, and 3.3 GHz), and varying resistance R (10 KOhm, 50 KOhm, 100 KOhm, 500 KOhm, 1 MOhm, 5 MOhm). Within each shmoo, the Y-axis represents increasing Vcs, while the X-axis represents increasing Vdd. Again, the white areas are the pass conditions and the black areas are the fail conditions. As shown, for high values of R and/or high frequency, there is a significant potential to incorrectly determine that the SRAM has passed the screening process. Indeed, the upper and lower bounds on the failure conditions squeeze together, thinning out the finger profile.

Figure 6B:
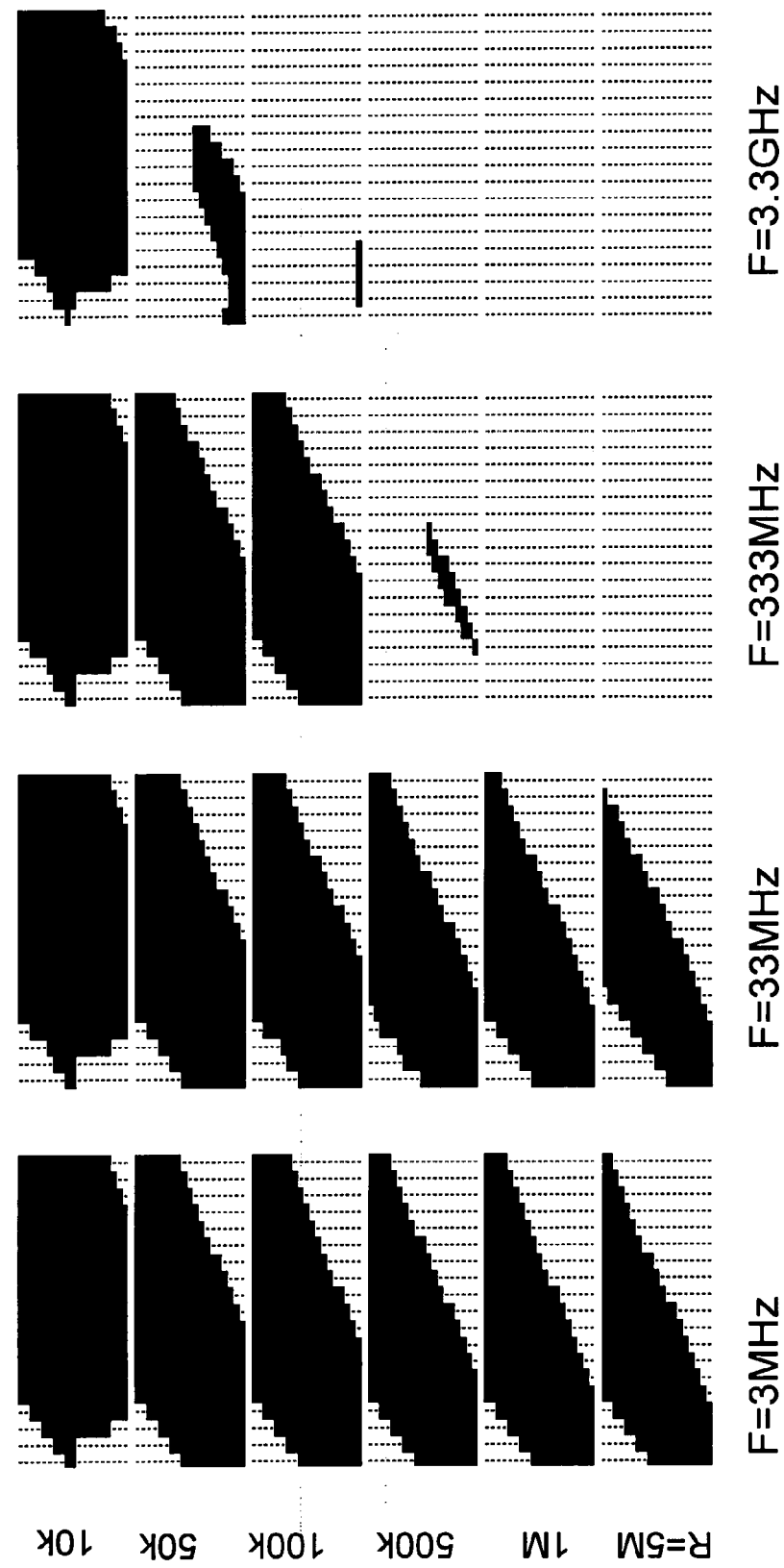
FIG. 6B are graphs illustrating pass/fail test results obtained by simulation using the novel screening techniques of the present invention, also over different supply voltage, leakage, and frequency conditions.

In contrast, with reference to FIG. 6B, pass/fail "shmoo" results are illustrated using one or more aspects of the present invention for sensing the BLT. The upper bound on the failure conditions disappear, thereby expanding the finger profile and increasing the detection of potential failures due to leakage, particularly at lower frequency.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A method of testing an SRAM cell, the SRAM cell including an anti-parallel storage circuit operable to store a logic high or low value across a true node and a complementary node, where the true node and complementary node are coupled to a true bit line (BLT) and a complementary bit line (BLC), by first and second transistors, respectively, the method comprising:

preventing a write driver circuit from significantly pulling the BLT towards a supply voltage;

preventing a pre-charge circuit from significantly pulling the BLT towards the supply voltage;

preventing the first transistor from significantly pulling the BLT towards the voltage stored in the SRAM cell; and comparing the voltage of the BLT under the foregoing conditions to a threshold voltage.

2. The method of claim 1, further comprising: determining that the SRAM cell includes significant leakage current when the voltage of the BLT is below the threshold voltage.

3. The method of claim 1, further comprising: determining that the SRAM cell includes significant leakage current when the voltage of the BLT drops linearly below the threshold voltage.

4. A method of testing an SRAM cell, the SRAM cell including an anti-parallel storage circuit operable to store a logic high or low value across a true node and a complementary node, where the true node and complementary node are coupled to a true bit line (BLT) and a complementary bit line (BLC), by first and second transistors, respectively, the method comprising:

preventing the first transistor from significantly pulling the BLT towards the voltage stored in the SRAM cell; and comparing the voltage of the BLT under at least the foregoing condition to a threshold voltage.

5. The method of claim 4, further comprising: preventing a write driver circuit from significantly pulling the BLT towards a supply voltage prior to the comparing step.

6. The method of claim 4, further comprising: preventing a pre-charge circuit from significantly pulling the BLT towards a supply voltage prior to the comparing step.

7. The method of claim 4, further comprising: determining that the SRAM cell includes significant leakage current when the voltage of the BLT is below the threshold voltage.

8. The method of claim 4, further comprising: determining that the SRAM cell includes significant leakage current when the voltage of the BLT drops linearly below the threshold voltage.

* * * * *